United States Patent
Tsuchiya et al.

(10) Patent No.: US 10,895,778 B2
(45) Date of Patent: Jan. 19, 2021

(54) SUBSTRATE FOR ELECTRO-OPTICAL DEVICE, ELECTRO-OPTICAL DEVICE, AND ELECTRONIC APPARATUS

(71) Applicant: SEIKO EPSON CORPORATION, Tokyo (JP)

(72) Inventors: Yutaka Tsuchiya, Hara-mura (JP); Takehiro Ono, Chino (JP); Yusuke Kinoe, Suwa (JP); Yoshitaka Hama, Chino (JP); Yasushi Kawakami, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/583,810

(22) Filed: Sep. 26, 2019

(65) Prior Publication Data

US 2020/0019015 A1 Jan. 16, 2020

Related U.S. Application Data

(62) Division of application No. 15/848,608, filed on Dec. 20, 2017, now Pat. No. 10,466,531, which is a (Continued)

(30) Foreign Application Priority Data

Sep. 30, 2015 (JP) ................... 2015-192904

(51) Int. Cl.
*G02B 5/08* (2006.01)
*G02F 1/1335* (2006.01)
(Continued)

(52) U.S. Cl.
CPC ......... *G02F 1/133553* (2013.01); *G02B 1/14* (2015.01); *G02B 5/08* (2013.01);
(Continued)

(58) Field of Classification Search
CPC ......... G02F 1/133553; G02F 1/133502; G02F 1/133345; G02F 1/133512;
(Continued)

(56) References Cited

U.S. PATENT DOCUMENTS

2015/0077686 A1* 3/2015 Koyama ............. G02F 1/13439
349/106
2016/0223722 A1 8/2016 Ahn

FOREIGN PATENT DOCUMENTS

JP 2001-330821 A 11/2001

OTHER PUBLICATIONS

Sep. 21, 2018 Office Action issued in U.S. Appl. No. 15/848,608.
(Continued)

*Primary Examiner* — Euncha P Cherry
(74) *Attorney, Agent, or Firm* — Oliff PLC

(57) ABSTRACT

An opposing substrate as a substrate for an electro-optical device includes a transparent base member and a light shielding portion disposed on a region between pixels on the base member. The light shielding portion includes a first reflective film and a second reflective film that is disposed to overlap the first reflective film and has a reflection rate lower than that of the first reflective film, and a first protective film that covers the first reflective film is provided between the first reflective film and the second reflective film.

17 Claims, 11 Drawing Sheets

Related U.S. Application Data division of application No. 15/193,266, filed on Jun. 27, 2016, now Pat. No. 9,885,908.

(51) Int. Cl.
| | | |
|---|---|---|
| *G02B 1/14* | (2015.01) | |
| *G02B 5/20* | (2006.01) | |
| *G02F 1/1333* | (2006.01) | |
| *G02F 1/1337* | (2006.01) | |
| *G02F 1/1343* | (2006.01) | |
| *G02F 1/1362* | (2006.01) | |
| *G02F 1/1368* | (2006.01) | |
| *G03B 21/00* | (2006.01) | |
| *G03B 33/12* | (2006.01) | |
| *H01L 27/32* | (2006.01) | |
| *H01L 51/52* | (2006.01) | |
| *H04N 5/232* | (2006.01) | |

(52) U.S. Cl.
CPC ........... *G02B 5/201* (2013.01); *G02F 1/1337* (2013.01); *G02F 1/1368* (2013.01); *G02F 1/13439* (2013.01); *G02F 1/133345* (2013.01); *G02F 1/133502* (2013.01); *G02F 1/133512* (2013.01); *G02F 1/133514* (2013.01); *G02F 1/133536* (2013.01); *G02F 1/134336* (2013.01); *G02F 1/136286* (2013.01); *G03B 21/006* (2013.01); *G03B 33/12* (2013.01); *H01L 27/322* (2013.01); *H01L 27/3272* (2013.01); *H01L 51/5215* (2013.01); *H01L 51/5231* (2013.01); *H01L 51/5284* (2013.01); *H04N 5/23293* (2013.01); *G02F 2001/133357* (2013.01); *G02F 2001/133368* (2013.01); *G02F 2001/133519* (2013.01); *G02F 2001/133565* (2013.01); *G02F 2001/134345* (2013.01); *G02F 2201/123* (2013.01); *G02F 2201/50* (2013.01); *G02F 2203/02* (2013.01); *G02F 2203/12* (2013.01); *H01L 51/5271* (2013.01); *H01L 2251/308* (2013.01); *H01L 2251/533* (2013.01); *H01L 2251/5315* (2013.01)

(58) Field of Classification Search
CPC ......... G02F 1/133514; G02F 1/133536; G02F 1/1337; G02F 1/134336; G02F 1/13439; G02F 1/136286; G02F 1/1368; G02F 2001/133565; G02F 2203/02; G02F 2203/12; G02F 2001/133368; G02F 2201/50; G02F 2001/133357; G02F 2001/133519; G02F 2001/134345; G02F 2201/123; G02B 1/14; G02B 5/08; G02B 5/201; G03B 21/006; G03B 33/12; H04N 5/23293; H01L 2251/308; H01L 2251/5315; H01L 2251/533; H01L 27/322; H01L 27/3272; H01L 51/5215; H01L 51/5231; H01L 51/5284; H01L 51/5271
USPC .......................................................... 359/850
See application file for complete search history.

(56) References Cited

OTHER PUBLICATIONS

Mar. 19, 2019 Office Action issued in U.S. Appl. No. 15/848,608.
Jun. 26, 2019 Notice of Allowance issued in U.S. Appl. No. 15/848,608.

\* cited by examiner

SUBSTRATE FOR ELECTRO-OPTICAL DEVICE, ELECTRO-OPTICAL DEVICE, AND ELECTRONIC APPARATUS

This is a Divisional Application of application Ser. No. 15/848,608, filed Dec. 20, 2017, which is a Divisional Application of application Ser. No. 15/193,266, filed Jun. 27, 2016, which claims priority to JP 2015-192904, filed Sep. 30, 2015. The disclosures of the prior applications are hereby incorporated by reference herein in their entirety.

BACKGROUND

1. Technical Field

The present invention relates to a substrate for an electro-optical device, and an electro-optical device and an electronic apparatus using the substrate for an electro-optical device.

2. Related Art

For example, as the electro-optical device, a liquid crystal device and an organic electroluminescence (EL) device or the like used in a display unit, such as a portable information terminal, a note type personal computer, and the like are known. In the substrate for an electro-optical device used in the electro-optical device, a light shielding film, which is called a black matrix (BM) for partitioning a plurality of pixels, is provided. By providing the light shielding film between pixels, light that leaks from between the pixels is blocked, and thus the reduction of contrast and color mixture are prevented and excellent display is realized.

For example, in JP-A-2001-330821, the electro-optical device including a pair of a first substrate and a second substrate is disclosed. A predetermined pattern is provided in a non-opening region of each pixel of the first substrate, and the light shielding film is provided in a region in which the predetermined pattern is at least partially covered in a case of viewing the predetermined pattern in a plane manner, in the second substrate that is oppositely disposed to the first substrate. The light shielding film is formed by laminating a high reflective film of a first reflection rate and a low reflective film of a second reflection rate lower than the first reflection rate. There is an example that the high reflective film covers the low reflective film. By providing the light shielding film on the second substrate, light incident on the high reflective film from the second substrate side is reflected. With this, it is unlikely for light to be incident on the non-opening region of each pixel. Meanwhile, it is unlikely for light, which is incident on the opening region of each pixel, reflected from the first substrate side, and returned toward the second substrate, to be incident on and reflected from the low reflective film. That is, since internal reflection is reduced between the first substrate and the second substrate which are oppositely disposed, it is possible to suppress the reduction of display quality caused by the internal reflection.

In the electro-optical device of JP-A-2001-330821, the predetermined pattern functions as a pixel switching thin film transistor (TFT), scan lines and data lines connected to the TFT, or the like. In addition, the light shielding film is provided in an island shape so as to overlap at least the TFT in a plane manner, or provided in a stripe shape or a lattice shape so as to overlap the scan lines and the data lines in a plane manner. As an example of the high reflective film constituting the light shielding film, there is an aluminum film including nitrogen compounds and refractory metal, and as an example of the low reflective film, there is a film including chromium oxide. As a method for forming the light shielding film, first, the high reflective film is formed on a substrate, and then patterning is performed on the high reflective film corresponding to the predetermined pattern. Accordingly, a method in which the low reflective film is formed to cover the high reflective film on which the patterning is performed, and patterning is performed on the low reflective film again, is considered. However, when positional accuracy is not sufficiently secured in the patterning of the low reflective film, there is a possibility that it may not reliably cover the high reflective film on which the patterning is performed. In addition, in etching processing of the patterning of the low reflective film, there is a possibility that defects occur by etching a part of the high reflective film. In particular, when the size of a pixel is high definition, since the width of the non-opening region between pixels on which the predetermined pattern is provided also becomes narrower, high positional accuracy is acquired in the patterning of the low reflective film. When a portion of the high reflective film that is not covered by the low reflective film exists, internal reflection in the portion becomes remarkable and then there is a possibility that characteristics of contrast or the like are partially reduced. In addition, when defects occur in a part of the high reflective film at the time of patterning of the low reflective film, there is a possibility that the reliability of the electro-optical device is impaired by diffusing the material of a defective high reflective film.

SUMMARY

The invention can be realized in the following aspects or application examples.

Application Example

According to this application example, there is provided a substrate for an electro-optical device used in an electro-optical device including a plurality of pixels including: a transparent base member; and a light shielding portion disposed on regions between pixels on the base member, in which the light shielding portion includes a first reflective film and a second reflective film that is disposed by overlapping the first reflective film and has a reflection rate lower than that of the first reflective film, and in which a first protective film that covers the first reflective film is provided between the first reflective film and the second reflective film.

In this application example, at the time of patterning the second reflective film, by variation of position accuracy in patterning, even when a part of the second reflective film is defective in portions corresponding to regions between pixels, since the first reflective film is covered by the first protective film, exposure or defects of a part of the first reflective film is prevented. That is, it is possible to provide the substrate for an electro-optical device capable of reducing problems of optical characteristics or reliability caused by defects or exposure in a part of the first reflective film in a region between the pixels.

In the substrate for an electro-optical device according to the application example, the first protective film may be formed from material having approximately the same refractive rate as the base member, and provided over at least a region including the plurality of pixels on the base member.

In this configuration, it is possible to suppress the reduction of transmissivity of light in pixels by providing the first protective film.

In the substrate for an electro-optical device according to the application example, the first protective film may be disposed to be located between the first reflective film and the second reflective film.

In this configuration, since the first protective film is not required to be transparent, a selection range of material constituting the first protective film is widened.

In the substrate for an electro-optical device according to the application example, the second reflective film may include an eaves portion protruded from a region on which the first reflective film is provided, in a planar manner on the base member.

In this configuration, it is possible to block, by using the eaves portion, a part of light incident on the base member from an oblique direction with respect to a normal line of a surface of the base member. For example, in a case where the light incident on the base member from an oblique direction is polarized, it is possible to reduce a ratio of polarized light, passing through the pixels, in which the polarization direction thereof is changed by being reflected by the second reflective film.

In the substrate for an electro-optical device according to the application example, the second reflective film may be formed from titanium nitride, and the thickness of the second reflective film may be equal to or greater than 50 nm.

In this configuration, it is possible to set reflection of visible light incident on the second reflective film to equal to or less than 50%.

The substrate for an electro-optical device according to the application example, may further include a transparent second protective film that covers the light shielding portion, and is provided over at least a region including the plurality of pixels.

In this configuration, it is possible to protect the second reflective film by a second protective film. In addition, since the second protective film has transmissivity, even in a case where the second protective film is provided over a region including a plurality of pixels, it is possible to suppress the reduction of the transmissivity of the pixels.

In the substrate for an electro-optical device according to the application example, it is preferable that the first protective film and the second protective film is formed from the same material.

In this configuration, it is possible to ensure the adhesion between protection films compared to a case where the first protective film and the second protective film are formed by different material. In addition, it is possible to form the first protective film and the second protective film by using the same film forming method or film forming apparatus, and improve productivity.

In the substrate for an electro-optical device according to the application example, a sectional shape of the light shielding portion on the base member may be a trapezoidal shape of which a bottom is formed from the first reflective film.

In this configuration, it is possible to effectively pass through light incident on the base member from an oblique direction with respect to a normal line of a surface of the base member.

In the substrate for an electro-optical device according to the application example, the light shielding portion may be provided to partition each of the plurality of pixels on the base member, and include a colored layer of a color filter which is provided to fill at least an opening portion partitioned by the light shielding portion.

In this configuration, it is possible to suppress unwanted reflection of light by the second reflective film, and provide a color filter substrate as the substrate for an electro-optical device having excellent optical characteristics.

The substrate for an electro-optical device according to the application example may further include a transparent planarization layer that covers the light shielding portion and the colored layer; and a transparent conductive film that covers the planarization layer.

In this configuration, it is possible to provide the color filter substrate as the substrate for an electro-optical device having excellent optical characteristics which can use the transparent conductive film, as electrodes, having a flat surface.

Application Example

According to this application example, there is provided an electro-optical device including the substrate for an electro-optical device according to the application example.

In this application example, it is possible to provide the electro-optical device having excellent optical characteristics.

Application Example

According to this application example, there is provided an electronic apparatus including the electro-optical device according to the application example.

In this application example, it is possible to provide the electronic apparatus having excellent display.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to the drawings. The drawings to be used are illustrated by appropriately enlarging or reducing them such that a description becomes a recognizable state.

First Embodiment

Electro-Optical Device

Figure 1:
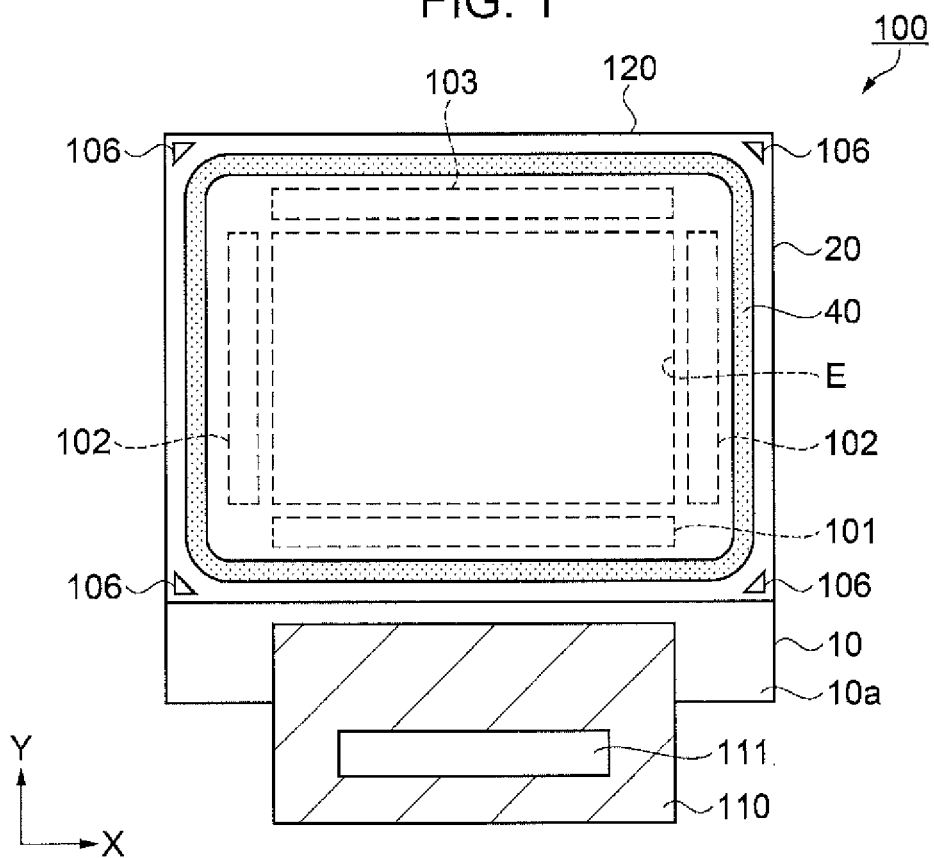
FIG. 1 is a schematic plan view illustrating a configuration of a liquid crystal device according to a first embodiment.
Figure 2:
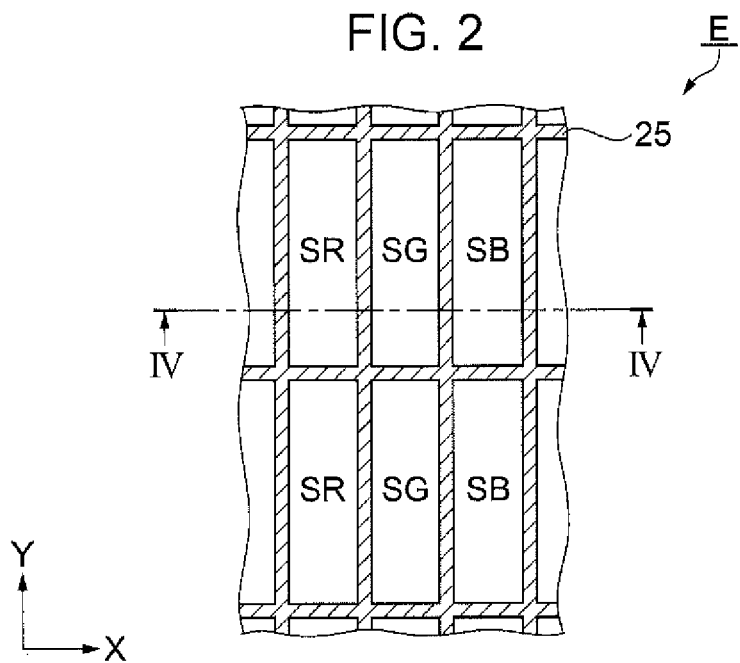
FIG. 2 is an enlarged view illustrating an arrangement of sub-pixels and a light shielding portion in a display region.
Figure 3:
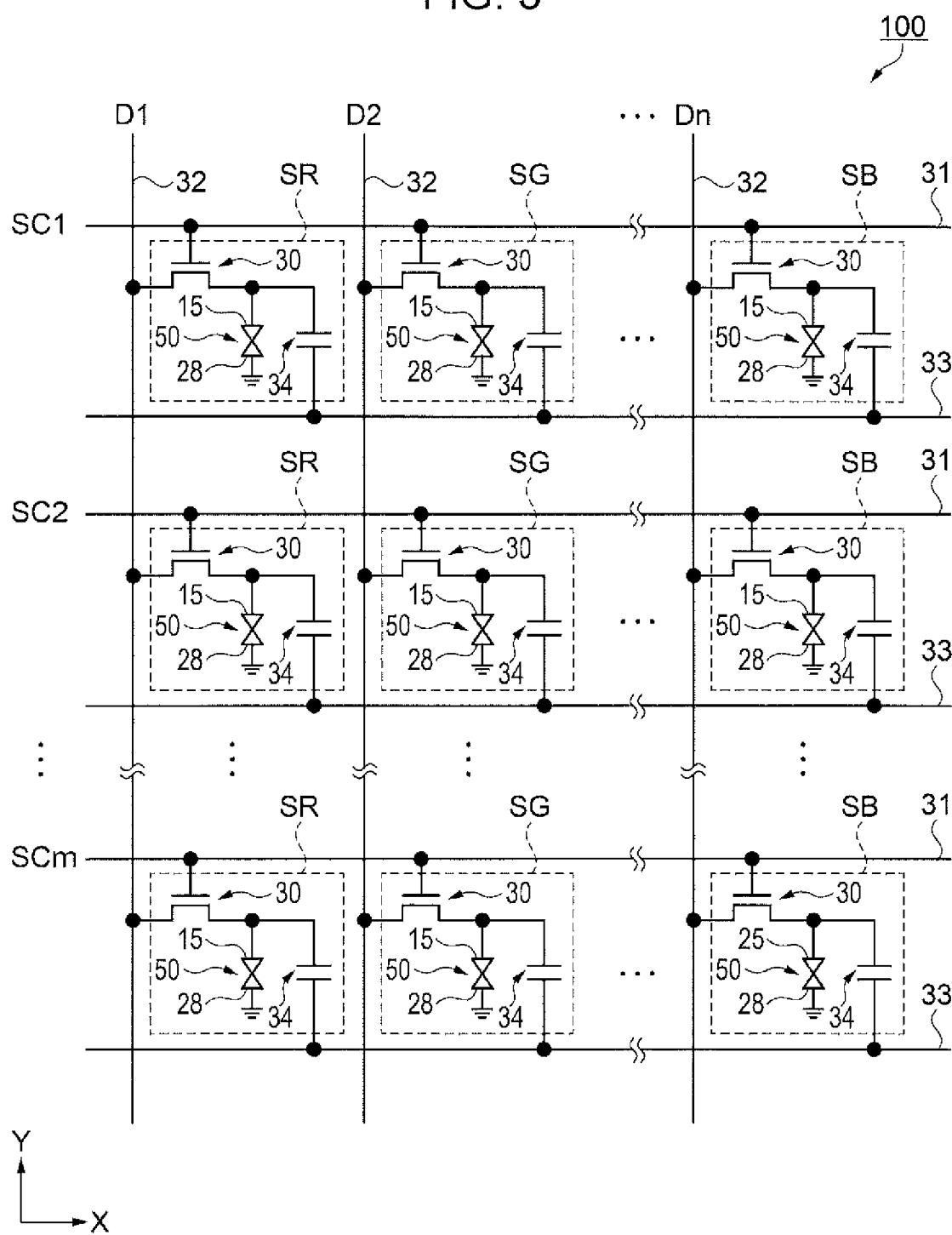
FIG. 3 is an equivalent circuit diagram illustrating an electrical configuration of the liquid crystal device.

As an example of an electro-optical device of the embodiment, a liquid crystal device will be described with reference to FIG. 1 to FIG. 3. FIG. 1 is a schematic plan view illustrating a configuration of the liquid crystal device according to a first embodiment. FIG. 2 is an enlarged view illustrating an arrangement of sub-pixels and a light shielding portion in a display region. FIG. 3 is an equivalent circuit diagram illustrating an electrical configuration of the liquid crystal device.

As illustrated in FIG. 1, the liquid crystal device 100 as the electro-optical device according to the embodiment is an active drive-type display device having a display region E on which a plurality of sub-pixels are disposed in a matrix shape.

The liquid crystal device 100 includes a liquid crystal panel 120 pinched by a liquid crystal layer 50 (see FIG. 4) between an element substrate 10 and an opposing substrate 20 which are oppositely disposed through sealing material 40 disposed in a frame shape. In addition, the liquid crystal device 100 includes a flexible printed circuit (hereinafter, referred to as FPC) 110 attached to a terminal portion 10a of the liquid crystal panel 120.

Hereinafter, in the description, an X axis direction is a direction along a side to which the FPC 110 of the liquid crystal panel 120 is attached, a Y axis direction is a direction along the other two sides perpendicular to the sides and opposite to each other, and a Z direction is a thickness direction of the liquid crystal panel 120 perpendicular to the X axis direction and the Y axis direction. In addition, a view from the opposing substrate 20 side in the Z direction is represented as a plane or a planar view.

The element substrate 10 includes the display region E on which a plurality of sub-pixels are arranged in the X axis direction and the Y axis direction in a matrix shape, a driving circuit (data line driving circuit 101 and scan line driving circuit 102) for driving the sub-pixels, an inspection circuit 103, and the like. The scan line driving circuit 102 is disposed between an outer edge (side) extending in the Y axis direction of the element substrate 10 and the display region E. The data line driving circuit 101 is disposed between a side to which the FPC 110 of the element substrate 10 is attached and the display region E. The inspection circuit 103 is disposed between a side extending along the X axis direction in the Y axis (+) direction side of the element substrate 10 and the display region E.

A side of the element substrate 10 is protruded from the opposing substrate 20, and the FPC 110 is attached to the protruded terminal portion 10a. A driving IC 111 is mounted on the FPC 110, and signals for driving the data line driving circuit 101, the scan line driving circuit 102, and the inspection circuit 103 are supplied to the element substrate 10.

Figure 4:
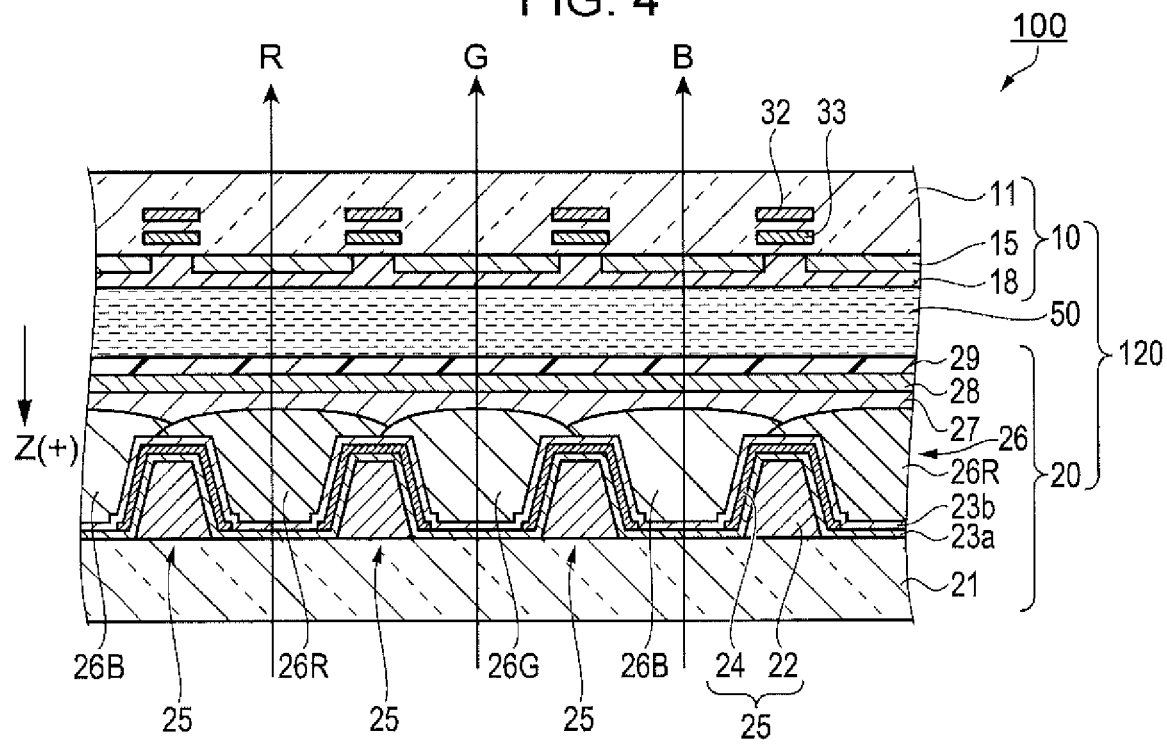
FIG. 4 is a sectional view of a liquid crystal panel taken along line IV-IV of the display region illustrated in FIG. 2.

The liquid crystal panel 120 is a display body capable of being in full color display, and a color filter 26 including colored layers 26R, 26G, and 26B of red (R), green (G), and blue (B) is disposed on the opposing substrate 20 (see FIG. 4). The opposing substrate 20 is an example of the "the substrate for an electro-optical device" in the invention.

As illustrated in FIG. 2, sub-pixels SR corresponding to red (R), sub-pixels SG corresponding to green (G), and sub-pixels SB corresponding to blue (B) are disposed on the display region E in the matrix shape. Specifically, the sub-pixels SR, SG, and SB of different colors are arranged in the X axis direction, the sub-pixels of the same color are arranged in the Y axis direction. The method of the arrangement of the sub-pixels SR, SG, and SB is referred to as a stripe method. In addition, each of the sub-pixels SR, SG, and SB is partitioned by a light shielding portion 25. That is, the light shielding portion 25 for partitioning the sub-pixels SR, SG, and SB by color is arranged in a lattice shape on the display region E.

These three sub-pixels SR, SG, and SB become a display unit of a schematically square shape in a plan view, and provide full color display. The invention is not limited to the color arrangement of the sub-pixels SR, SG, and SB of the stripe method described above, and may be, for example, another color arrangement (mosaic arrangement and delta arrangement) in the Y axis direction. In addition, the display unit may include sub-pixels of another color (for example, yellow) other than the three sub-pixels SR, SG, and SB.

The liquid crystal device 100 is a transmissive type device, and adopts an optical design of a normally white mode in which the sub-pixels SR, SG, and SB are brightly displayed at the time of non-driving and a normally black mode in which the sub-pixels SR, SG, and SB are darkly displayed at the time of the non-driving. In addition, polarization plates are disposed and used in each of an incident side and an emission side of light of the liquid crystal panel 120 according to the optical design.

As illustrated in FIG. 3, the liquid crystal device 100 includes a plurality of scan lines 31, a plurality of data lines 32, and a plurality of capacitance lines 33 which are insulated from and perpendicular to one another on at least the display region E. On the display region E, the scan lines 31 and the capacitance lines 33 are extended in the X axis direction, and the data lines 32 are extended in the Y axis direction.

A region that is partitioned by the scan lines 31, the capacitance lines 33, and the data lines 32 becomes the sub-pixels. Each of the sub-pixels SR, SG, and SB includes pixel electrodes 15, thin film transistors (hereinafter, referred to as TFT) 30, retention capacitors 34, and the like.

The scan line 31 is electrically connected to a gate electrode of the TFT 30, and the data line 32 is electrically connected to a source electrode of the TFT 30. The pixel electrode 15 is electrically connected to a drain electrode of the TFT 30.

The data line 32 is connected to the data line driving circuit 101 (see FIG. 1), and image signals D1, D2, . . . , and Dn from the data line driving circuit 101 are supplied to the sub-pixels. The scan lines 31 are connected to the scan line driving circuit 102 (see FIG. 1), and scan signals SC1, SC2, . . . , and SCm from the scan line driving circuit 102 are supplied to the sub-pixels.

The image signals D1 to Dn may be supplied from the data line driving circuit 101 to the data lines 32 in order using a line sequential manner, or may be supplied for each group to a plurality of data lines 32 that are adjacent to each other. The scan signals SC1, SC2, . . . , and SCm are line-sequentially supplied from the scan line driving circuit 102 to the scan lines 31 in a pulsed manner using a line sequential manner at a predetermined timing.

The liquid crystal device 100 is configured to write image signals D1 to Dn supplied from the data lines 32 in the pixel electrodes 15 when the TFT 30 that is a switching element is in a turned on state for a predetermined period by inputting the scan signals SC1 to SCm. Accordingly, image signals D1 to Dn of a predetermined level written in the liquid crystal layer 50 through the pixel electrodes 15 are held for a predetermined period between the pixel electrodes 15 and opposing electrodes 28 opposite to the pixel electrodes 15 through the liquid crystal layer 50.

In order to prevent the leakage of the held image signals D1 to Dn, the retention capacitor 34 is connected in parallel to a liquid crystal capacitor formed between the pixel electrodes 15 and the opposing electrodes 28. The retention capacitor 34 is provided between a drain electrode of the TFT 30 and the capacitance lines 33.

The data lines 32 are connected to the inspection circuit 103 illustrated in FIG. 1, and configured to be able to confirm operation defects or the like of the liquid crystal device 100 by detecting the image signal in the manufacturing process of the liquid crystal device 100. However, the configuration is omitted in an equivalent circuit of FIG. 3.

In addition, the inspection circuit 103 may include a sampling circuit that supplies a sampled signal obtained by sampling the image signal to the data lines 32, and a precharge circuit that supplies a precharge signal of a predetermined voltage level before the image signal to the data lines 32.

Overview of Liquid Crystal Panel

Figure 5:
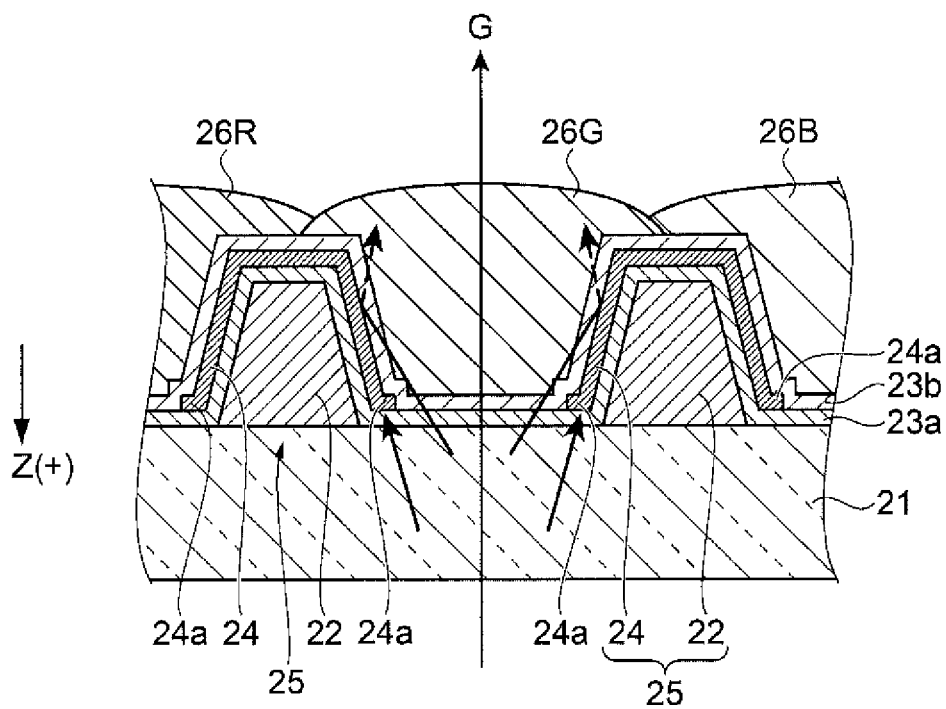
FIG. 5 is an enlarged sectional view illustrating a structure of the light shielding portion and a colored layer on an opposing substrate.

Next, an overview of the liquid crystal panel will be described with reference to FIG. 4 and FIG. 5. FIG. 4 is a sectional view of the liquid crystal panel taken along line IV-IV of a display region illustrated in FIG. 2. FIG. 5 is an enlarged sectional view illustrating a structure of the light shielding portion and a colored layer on the opposing substrate.

As illustrated in FIG. 4, the liquid crystal panel 120 includes the element substrate 10 and the opposing substrate 20 which are spaced in the Z axis direction, and the liquid crystal layer 50 to which liquid crystal is filled between the element substrate 10 and the opposing substrate 20.

The pixel electrodes 15 and the alignment film 18 are sequentially laminated in the Z axis (+) direction of the base member 11 of the element substrate 10.

For example, the base member 11 of the element substrate 10 uses a transparent substrate such as quartz, alkali-free glass, and the like. As described above, the TFT 30, the scan lines 31, the data lines 32, the capacitance lines 33, the retention capacitor 34, the data line driving circuit 101, the scan line driving circuit 102, the inspection circuit 103, lines that electrically connect these items, and the like are formed on the base member 11 by known technology. The TFT 30, the scan lines 31, the data lines 32, the capacitance lines 33, and the retention capacitor 34 are provided between adjacent pixel electrodes 15, that is, between sub-pixels. In FIG. 4, from a side near the pixel electrodes 15, the capacitance lines 33 and the data lines 32 are displayed.

The pixel electrodes 15 are formed by using a transparent conductive film such as an indium tin oxide (ITO) film, and the like. An alignment film 18 covers the pixel electrodes 15, and is disposed over at least the display region E.

In the Z axis (−) direction of the base member 21 of the opposing substrate 20, the light shielding portion 25, the color filter 26, an overcoat layer (hereinafter, referred to as OC layer) 27 as a planarization layer, the opposing electrodes 28, and the alignment film 29 are sequentially laminated.

The base member 21 is configured by the transparent substrate such as quartz, alkali-free glass, and the like, similar to the base member 11, such that light passes through. The light shielding portion 25 is configured to include a first reflective film 22 having light reflectivity, and a second reflective film 24, which is disposed to be overlapped with the first reflective film 22, having a reflection rate lower than that of the first reflective film 22.

For example, aluminum, aluminum alloy, silver, silver alloys, tungsten silicide, or the like can be used in the first reflective film 22. For example, metal nitride, tungsten silicide, or the like can be used in the second reflective film 24. In the embodiment, the first reflective film 22 is formed by using the aluminum alloy, and the second reflective film 24 is formed by using titanium nitride (TiN).

In addition, in the embodiment, a first protective film 23a that covers the first reflective film 22 is provided between the first reflective film 22 and the second reflective film 24. In addition, a second protective film 23b that covers the second reflective film 24 is provided. Theses protective films 23a and 23b are disposed over the display region E on which at least a plurality of the pixel electrodes 15 are disposed. These protective films 23a and 23b have approximately the same refractive rate (n=1.46 to 1.50) as the base member 21, and for example, are formed so as to have translucency by using silicon oxide or the like. The first protective film 23a and the second protective film 23b may be formed by using the same material, or the first protective film 23a and the second protective film 23b may be formed by using different material.

The color filter 26 includes the colored layer that converts white light into color light of a predetermined wavelength range. In addition, the colored layer is disposed to fill a region between the light shielding portions 25 that are adjacently disposed. First, on the display region E illustrated in FIG. 2, the colored layer 26R of red (R) is disposed in the sub-pixels SR, the colored layer 26G of green (G) is disposed in sub-pixels SG, and the colored layer 26B of blue (B) is disposed in the sub-pixels SB. In a top portion side of the light shielding portion 25 of which a sectional shape is trapezoidal, a top portion thereof is covered by overlapping the colored layers having different colors. As described above, in a case where the display unit includes sub-pixels other than red (R), green (G), and blue (B), the colored layer is disposed other than red (R), green (G), and blue (B) corresponding to the sub-pixels.

A surface of the color filter 26 includes unevenness depending on a forming method of the colored layers 26R, 26G, and 26B. Therefore, by considering the effect of the unevenness on the liquid crystal layer 50 in order to alleviate the unevenness, the OC layer 27 that covers the color filter 26 is provided.

For example, the OC layer 27 is formed by acrylic transparent resin, the planarization processing such as chemical mechanical polishing (CMP), and the like is performed on a surface thereof. The planarization processing is not essential. It is possible to implement planarization on the surface of the OC layer 27 according to the degree of the unevenness and a formation method of the OC layer 27 on the surface of the color filter 26.

The opposing electrodes 28 are configured by using a transparent conductive film such as an indium tin oxide (ITO) film, or the like, similar to the pixel electrodes 15. The alignment film 29 covers the opposing electrodes 28, and is disposed over at least the display region E.

As the alignment film 18 that covers the pixel electrodes 15 and the alignment film 29 that covers the opposing electrodes 28, which are in contact with the liquid crystal layer 50, for example, an organic alignment film such as polyimide or the like on which alignment processing that approximately horizontally aligns liquid crystal molecules having positive dielectric anisotropy in a predetermined direction is performed, and, for example, an inorganic alignment film such as silicon oxide or the like on which liquid crystal molecules having negative dielectric anisotropy, and the like are approximately vertically aligned in the predetermined direction can be used.

As illustrated in FIG. 4, in the embodiment, white light emitted from a light source is incident from the opposing substrate 20 side, and emitted as display light by passing through the color filter 26, the liquid crystal layer 50, and the element substrate 10. The white light passed through the colored layer 26R of the color filter 26 is converted into red light, the white light passed through the colored layer 26G is converted into green light, and the white light passed through the colored layer 26B is converted into blue light. In addition, the white light incident on the light shielding portion 25, especially, the first reflective film 22 is reflected.

In addition, as described above, since the polarization plate is disposed on an incident side of light of the liquid crystal panel 120 on the basis of optical design, by passing the white light incident on the liquid crystal panel 120 through the polarization plate, the white light is converted into linear polarized light. The linear polarized light incident from the opposing substrate 20 side is not necessarily incident from the normal line direction with respect to an incidence plane of the opposing substrate 20.

In the embodiment, as described in FIG. 5, the first reflective film 22 is configured to implement a sectional view of the first reflective film 22 as a trapezoid in a surface opposite to an incident surface of light of the base member 21. The second reflective film 24 is formed by a trapezoid similar to the first reflective film 22 disposed at a position that is overlapped with the first reflective film 22. In addition, the second reflective film 24 is provided to slightly protrude from a region where the first reflective film 22 is provided, and includes the eaves portion 24a protruded between the adjacent light shielding portions 25. Therefore, a part of the linear polarized light obliquely incident on the eaves portion 24a with respect to the normal line direction is reflected and absorbed by the eaves portion 24a. In addition, a part of the linear polarized light incident on an inclined surface of the second reflective film 24 of a trapezoidal shape is also reflected and absorbed. In particular, the linear polarized light reflected from the inclined surface of the second reflective film 24 may cause unevenness in a polarization state of the green light passing through the liquid crystal layer 50 between the pixel electrodes 15 and the opposing electrodes 28, after passing through the colored layer 26G due to variation of a direction of the polarization axis according to the reflection. That is, the linear polarized light may affect characteristics such as contrast or the like in display. In the embodiment, since the second reflective film 24 is formed by using material having a low reflection rate compared to the first reflective film 22, it is possible to reduce a rate of the linear polarized light in which the direction of the polarization axis is varied by reflecting the linear polarized light in the inclined surface of the second reflective film 24. In other words, the unevenness in the polarization state of the green light can be reduced. FIG. 5 is a diagram enlarging a portion to which the colored layer 26G is provided. However, similar to a portion to which other colored layers 26R and 26B are provided, the unevenness in the polarization state of the red light and the green light can also be reduced.

Method for Manufacturing Substrate for Electro-Optical Device

Figure 6:
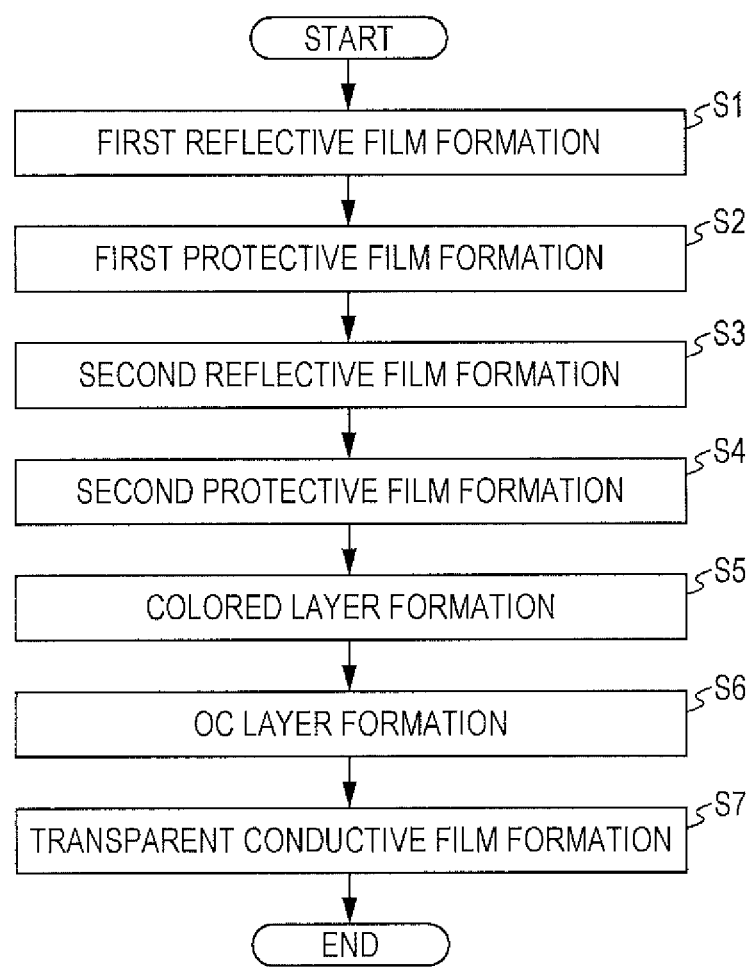
FIG. 6 is a flow chart illustrating a method for manufacturing an opposing substrate.

Next, a method for manufacturing the opposing substrate 20 as the substrate for an electro-optical device of the embodiment will be described with reference to FIG. 6 to FIG. 17. FIG. 6 is a flow chart illustrating a method for manufacturing the opposing substrate. FIG. 7 to FIG. 16 are schematic sectional views illustrating the method for manufacturing the opposing substrate. FIG. 17 is a block illustrating a relationship between the thickness and the reflection rate of titanium nitride.

As described in FIG. 6, the method for manufacturing the opposing substrate 20 of the embodiment includes a first reflective film forming process (step S1), a first protective film forming process (step S2), a second reflective film forming process (step S3), a second protective film forming process (step S4), a colored layer forming process (step S5), an OC layer forming process (step S6), and a transparent conductive film forming process (step S7).

Figure 7:
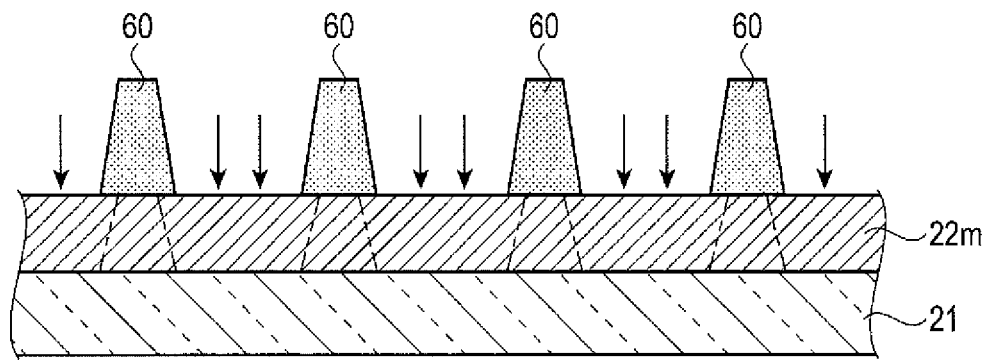
FIG. 7 is a schematic sectional view illustrating the method for manufacturing an opposing substrate.
Figure 8:
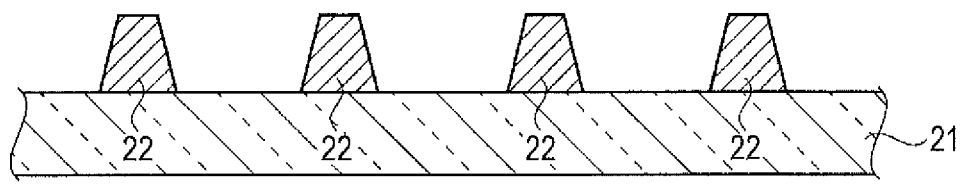
FIG. 8 is a schematic sectional view illustrating the method for manufacturing an opposing substrate.

In the first reflective film forming process of step S1, as described in FIG. 7, first, for example, the reflective film 22m of aluminum alloy is formed on the base member 21, by using a film forming method such as sputtering and evaporation. The thickness of the reflective film 22m is, for example, 1.0 μm to 1.5 μm (micrometer). In the embodiment, the colored layer is formed in a region surrounded later by the light shielding portion 25. Since optical characteristics (transmissivity, chromaticity, and chroma) of the colored layer depend on the thickness of the colored layer, the thickness of the reflective film 22m is set by considering the thickness based on the optical characteristics of the colored layer. Subsequently, a resist pattern 60 is formed in a position corresponding to the first reflective film 22 by performing exposure and development on which, for example, a photosensitive resist is formed on the reflective film 22m. The photosensitive resist may be used one of a positive type and a negative type, and is formed by applying and drying photosensitive resist liquid, for example, by a spin coating method and the like. The thickness of the photosensitive resist is, for example, approximately 2 µm. Accordingly, the reflective film 22*m* on which the resist pattern 60 is formed is etched. As the etching method, for example, there are a wet etching using an etching solution including phosphoric acid, nitric acid, and the like, and a dry etching using processing gas including boron trichloride gas ($BCl_3$), chlorine gas ($Cl_2$), and the like. The thickness of the reflective film 22*m* is a thickness in units of micrometers. When etching is performed on the reflective film 22*m*, as described in FIG. 8, the first reflective film 22 of which a sectional shape is patterned in a trapezoidal shape is obtained. The length of the base of the first reflective film 22 of the trapezoid, that is, the width of the first reflective film 22 is, for example, 1.0 µm to 1.5 µm. An arrangement pitch of the adjacent first reflective films 22 is the same as that of the sub-pixels, for example, approximately 3 µm. As material of the first reflective film 22, aluminum having a higher reflection rate than that of aluminum alloy may be used. In processing after this, in a case of the heating of equal to or greater than 350° C., since hillock (hemispherical protrusion) is easily generated on a surface of an aluminum film, it is preferable to use aluminum alloy including metal such as Si and Cu which easily generate the hillock. In addition, after etching the reflective film 22*m*, a peeling process for removing the resist pattern 60 is performed. As the peeling method of the resist pattern 60, for example, there is a method using a peeling solution of an organic alkali system. Accordingly, the process proceeds to step S2.

Figure 9:
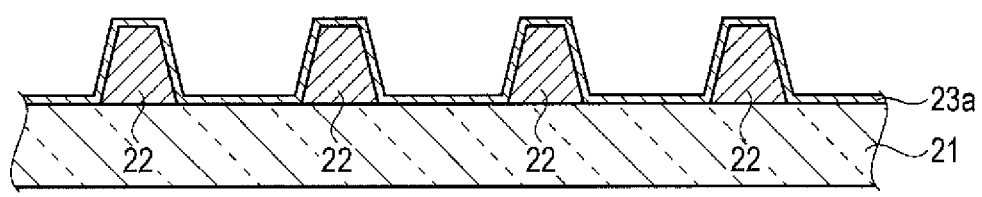
FIG. 9 is a schematic sectional view illustrating the method for manufacturing an opposing substrate.

In the first protective film forming process of step S2, as described in FIG. 9, the first protective film 23*a* is formed to cover a surface of the base member 21 on which the first reflective film 22 is formed. As a forming method of the first protective film 23*a*, there is a method for forming a $SiO_x$ film (silicon oxide film) by a plasma CVD method using processing gas including, for example, monosilane ($SiH_4$) and nitrous oxide gas ($N_2O$). The thickness of the first protective film 23*a* is, for example, 60 nm (nanometer). Accordingly, process proceeds to step S3.

Figure 10:
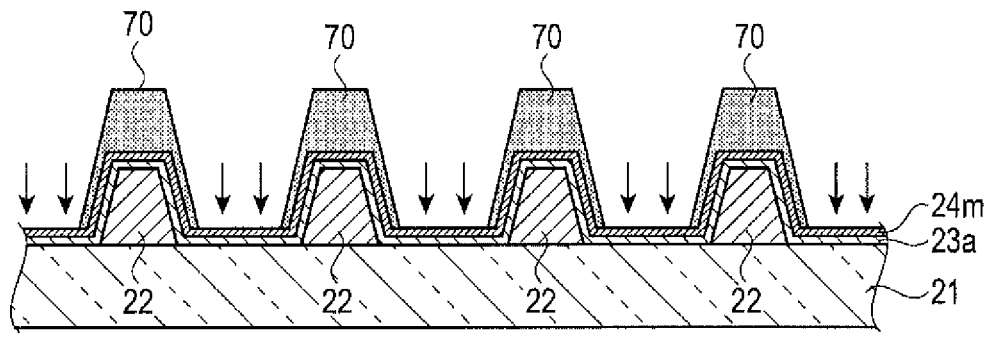
FIG. 10 is a schematic sectional view illustrating the method for manufacturing an opposing substrate.
Figure 11:
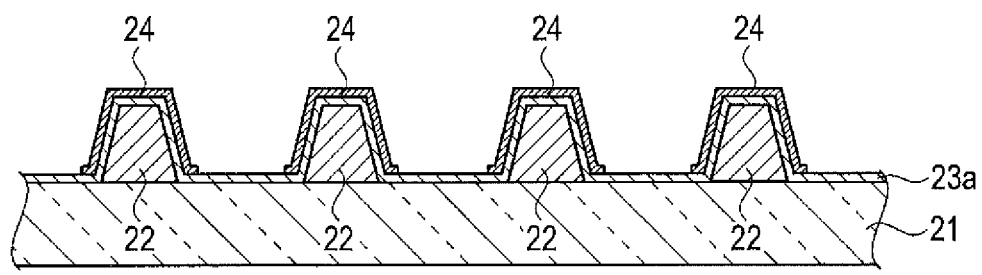
FIG. 11 is a schematic sectional view illustrating the method for manufacturing an opposing substrate.

In the second reflective film forming process of step S3, as described in FIG. 10, first, by using the sputtering, the evaporation, or the like to cover the first protective film 23*a*, for example, the reflective film 24*m* of TiN is formed. For example, the thickness of the reflective film 24*m* is 150 nm. The reflection rate of the reflective film 24*m* of TiN lower than the reflection rate of the first reflective film 22 is configured. As described in a graph of FIG. 17, the thickness of TiN is approximately 20 nm. However, a reflection rate in the wavelength of light shorter than 500 nm is equal to or less than 30%, and a reflection rate exceeds 50% when the wavelength is equal to or greater than 600 nm. As the embodiment, since the thickness of TiN is approximately 150 nm, it is possible to set a reflection rate of a visible light wavelength range (450 nm to 700 nm) to less than 50%. In view of setting the reflection rate of the visible light wavelength range (450 nm to 700 nm) to equal to or less than 50%, as illustrated in a graph of FIG. 17, the thickness of TiN is required for setting at least 50 nm. The reflection rate of a graph illustrated in FIG. 17 is a reflection rate at the time of setting the reflection rate of aluminum film to 100%.

Subsequently, similar to the first reflective film forming process, a resist pattern 70 is formed at a position corresponding to the second reflective film 24 by performing exposure and development in which the photosensitive resist is formed on the reflective film 24*m*. Similarly, the thickness of the photosensitive resist is, for example, approximately 2 µm. Accordingly, the reflective film 24*m* on which the resist pattern 70 is formed is etched. As the etching method, for example, there are wet etching using fluorine-based etching solution and dry etching using processing gas including chlorine gas and nitrogen gas. In the wet etching, since it is difficult to control the etching so as to not perform the etching on the first protective film 23*a* of a lower layer of the reflective film 24*m*, the reflective film 24*m* is etched by using the dry etching that easily controls the etching in the embodiment. Subsequently, the peeling process for removing the resist pattern 70 is performed. The peeling process is the same as that of the resist pattern 60 described above. With this, as described in FIG. 11, the second reflective film 24 is formed at a position on which the second reflective film 24 is overlapped with the first reflective film 22 through the first protective film 23*a*. With this, the light shielding portion 25 including the first reflective film 22 and the second reflective film 24 is formed. Accordingly, the process proceeds to step S4.

Figure 12:
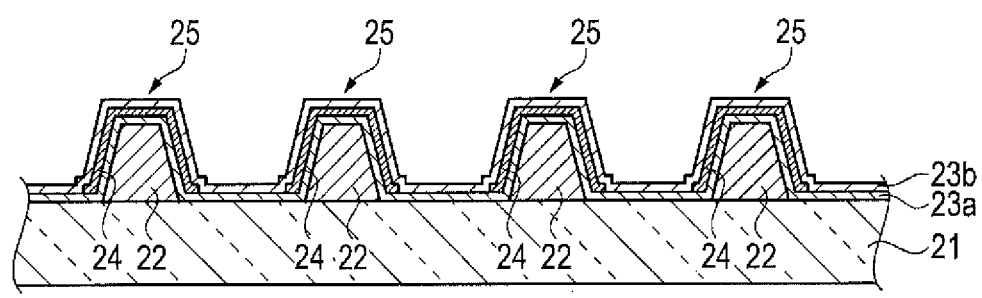
FIG. 12 is a schematic sectional view illustrating the method for manufacturing an opposing substrate.

In the second protective film forming process of step S4, as described in FIG. 12, second protective film 23*b* is formed to cover a surface of the base member 21 on which the light shielding portion 25 is formed. A method of forming the second protective film 23*b* forms the $SiO_x$ film by the plasma CVD method, similar to the first protective film 23*a*. For example, the thickness of the second protective film 23*b* is 50 nm. In the embodiment, since light incident between adjacent light shielding portions 25 passes through the colored layer, it is necessary to secure translucency over a visible light wavelength region for the first protective film 23*a* and the second protective film 23*b* formed and deposited between the adjacent light shielding portions 25. Therefore, it is preferable to adjust each wavelength thereof in order to set the total of the thickness of the first protective film 23*a* and the second protective film 23*b* to equal to or less than 110 nm where it is difficult to generate the absorption and reflection of light in a specific wavelength, after laminating the first protective film 23*a* and the second protective film 23*b*. In the embodiment, the "translucency" refers to characteristics that light of the visible light wavelength range passes through at least equal to or greater than 85%. Accordingly, process proceeds to step S5.

Figure 13:
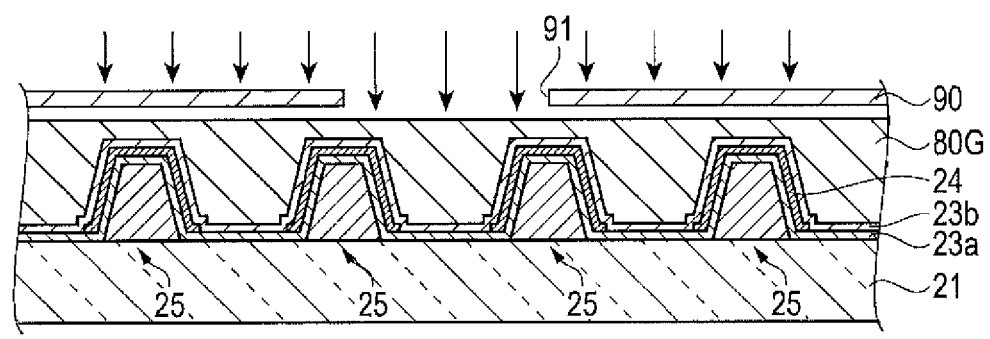
FIG. 13 is a schematic sectional view illustrating the method for manufacturing an opposing substrate.
Figure 14:
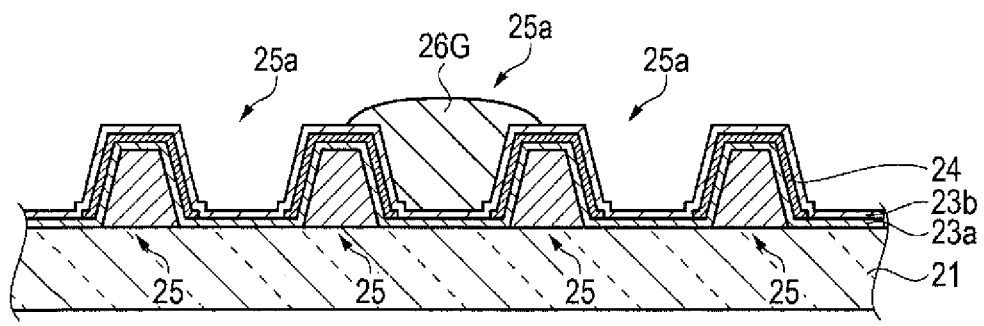
FIG. 14 is a schematic sectional view illustrating the method for manufacturing an opposing substrate.
Figure 15:
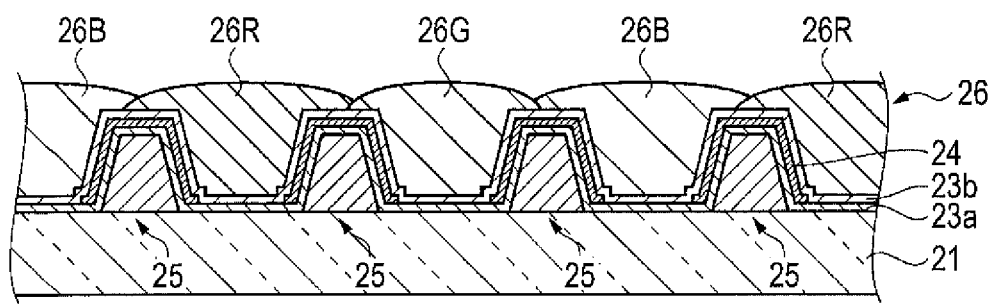
FIG. 15 is a schematic sectional view illustrating the method for manufacturing an opposing substrate.

In the colored layer forming process of step S5, as described in FIG. 13, first, a photosensitive color resist layer 80G is formed on the base member 21 on which the light shielding portion 25 and the second protective film 23*b* are formed. Specifically, for example, the photosensitive color resist layer 80G is formed by coating and drying negative type photosensitive color resist liquid including green color material by using the spin coating method so as to fill the photosensitive color resist layer 80G between the light shielding portions 25 with the photosensitive color resist liquid. The photosensitive color resist layer 80G is exposed by using a mask 90 including an opening portion 91 corresponding to a formation region of the colored layer 26G. In the development process, since the photosensitive color resist layer 80G in a portion that is exposed remains, as described in FIG. 14, the colored layer 26G of green (G) is formed in a colored layer formed region 25*a* between the adjacent light shielding portions 25. In the embodiment, the thickness of the photosensitive color resist layer 80G is greater than that of the height of the light shielding portion 25 of the second protective film 23*b* that is covered on the base member 21. The colored layer 26G is formed such that an end portion of the colored layer 26G is formed on the light shielding portion 25 that is covered by the second protective film 23*b*. Hereinafter, similar to the colored layer 26G, as described in FIG. 15, the colored layer 26R and the colored layer 26B are sequentially formed. With this, the color filter 26 including the colored layers 26R, 26G, and 26B is formed. However, sequential formation of the colored layers 26R, 26G, and 26B is not limited to being formed in the order of green (G), red (R), and blue (B). In addition, the thickness of the colored layers 26R, 26G, and 26B may be different. As described above, by considering the optical characteristics of the color filter 26, the thickness of each of the colored layers 26R, 26G, and 26B is set. In addition, the colored layer may be formed by coating and drying a solution including a desired color of a colored layer forming material on the colored layer formed region 25a, through an ink jet method (droplet discharge method), without limiting a method for coating the photosensitive color resist solution by the spin coating method, based on the size of the sub-pixels, that is, the size of the colored layer formed region 25a. In addition, the photosensitive color resist solution is not limited to the negative type, and may be the positive type. Accordingly, the process proceeds to step S6.

Figure 16:
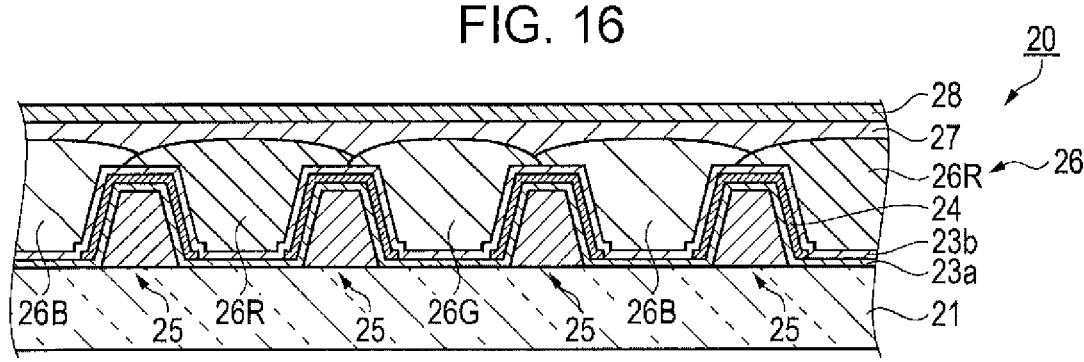
FIG. 16 is a schematic sectional view illustrating the method for manufacturing an opposing substrate.
Figure 17:
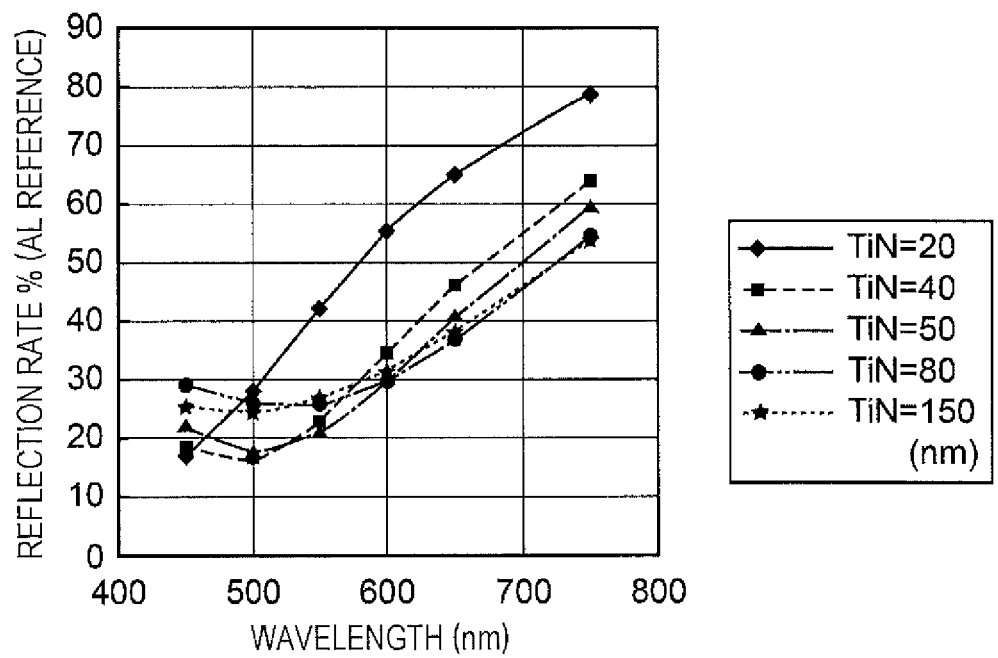
FIG. 17 is a graph illustrating a relationship between the thickness and a reflection rate of titanium nitride.

In the OC layer forming process of step S6 and the transparent conductive film forming process of step S7, as described in FIG. 16, first, the OC layer 27 is formed by coating and drying a solution including, for example, acrylic transparent resin through the spin coating method in order to cover the color filter 26. The planarization processing for planarizing the surface of the formed OC layer 27 such as CMP processing may be performed according to an unevenness situation of a surface of the formed OC layer 27. The OC layer 27 is not limited to being formed by using organic material. For example, the OC layer 27 may be formed by using inorganic material such as a silicon compound. Accordingly, through the sputtering, the evaporation, and the like, the opposing electrodes 28 are formed by forming the transparent conductive film, for example, the ITO film, or the like on the OC layer 27. The thickness of the opposing electrodes 28 is, for example, approximately 200 nm. Then, the alignment film 29 that covers the opposing electrodes 28 is formed, and the opposing substrate 20 is formed.

Figure 18:
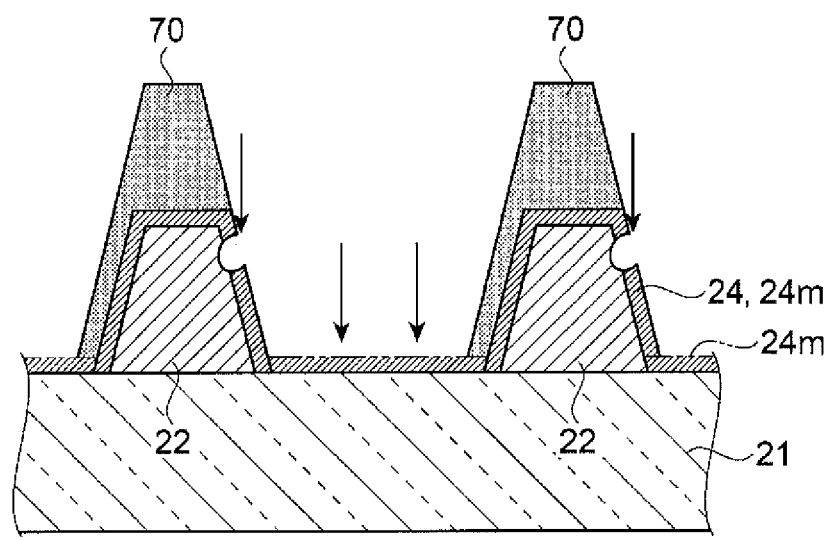
FIG. 18 is a schematic sectional view illustrating a method for manufacturing an opposing substrate of a comparison example.

Next, the opposing substrate 20 of the embodiment and a method for manufacturing thereof will be described with reference to FIG. 18. FIG. 18 is a schematic sectional view illustrating a method for manufacturing an opposing substrate of a comparison example.

As described in FIG. 18, as the method for manufacturing the opposing substrate of the comparison example, for example, the reflective film 24m is formed to cover the first reflective film 22 without forming the first protective film 23a, after forming the first reflective film 22. Accordingly, it is considered to perform a patterning method by which the resist pattern 70 is formed and the reflective film 24m is etched. At this time, when a part of the reflective film 24m that covers an inclined surface of, for example, a trapezoidal shape of the first reflective film 22, is exposed, by deviating a position of the resist pattern 70 with respect to the first reflective film 22, the reflective film 24m of a portion that is exposed is etched. Since it is preferable that the thickness of the reflective film 24m is at least equal to or greater than 50 nm as described above, when proceeding with the dry etching, there is a possibility that a defect is generated by partially etching the first reflective film 22.

In addition, the reflective film 24m is etched in the dry etching. However, even in a case where processing gas is selected without etching the first reflective film 22, when a peeling solution of organic alkali system for removing the resist pattern 70 is used, and a portion of the first reflective film 22 on which the reflective film 24m is etched and exposed, there is a possibility that a defect caused by dissolving the portion according to the usage of the peeling solution is generated. Then, a part of the linear polarized light incident from an inclined direction with respect to the base member 21 illustrated in FIG. 5, is incident on a defect portion of the first reflective film 22 illustrated in FIG. 18, and then the part of the linear polarized light is scattered. That is, an effect suppressing the scattering of the linear polarized light is partially lost by providing the second reflective film 24 having a reflection rate lower than that of the first reflective film 22.

Particularly, as the embodiment, in a case where the light shielding portion 25 having a width of 1.0 µm to 1.5 µm is formed, it is difficult to sufficiently secure positional accuracy with respect to the first reflective film 22 of the resist pattern 70. When the width of the resist pattern 70 is enlarged by considering the positional accuracy of the resist pattern 70, there is a possibility that a size of the opening portion of sub-pixels partitioned by the light shielding portion 25 decreases, the transmissivity of light passing through the sub-pixels is lowered, and a brightness and contrast ratio in the display is reduced.

For this reason, according to the method for manufacturing the opposing substrate 20 of the embodiment, the first protective film 23a that covers the first reflective film 22 is formed. That is, since the first reflective film 22 is protected by the first protective film 23a, even in a state where the positional accuracy of the resist pattern 70 is not sufficiently secured, it is possible to partially prevent a defect for the first reflective film 22, at the time of patterning in the reflective film 24m.

According to the method for manufacturing the liquid crystal device 100 and the opposing substrate 20 of the first embodiment, the following effect is obtained.

(1) On the base member 21, the first protective film 23a is formed to cover the first reflective film 22 of which a sectional shape is a trapezoidal shape. Furthermore, the light shielding portion 25 is configured by forming the second reflective film 24 to overlap the first reflective film 22 in a plan view. The first reflective film 22 is configured by using aluminum alloy, and the second reflective film 24 is formed by using titanium nitride (TiN). Therefore, since the reflection rate of the second reflective film 24 is smaller than that of the first reflective film 22, it is difficult to reflect a part of the linear polarized light incident on the inclined surface of the second reflective film 24. Accordingly, since it is difficult to mix the linear polarized light, of which the direction of the polarization axis is changed by reflecting the linear polarized light at an inclined surface of the second reflective film 24, to the linear polarized light passing through between the adjacent light shielding portions 25, it is possible to provide the liquid crystal device 100 having good display quality by suppressing the reduction of contrast in the sub-pixels.

(2) Since the first reflective film 22 is protected by the first protective film 23a, when patterning the second reflective film 24, even in a case where the deviation is generated at a position where the positional accuracy of the resist pattern 70 is not sufficiently secured, it is possible to prevent problems that the first reflective film 22 is etched, or dissolved by the peeling solution. That is, it is possible to effectively manufacture the opposing substrate 20. In addition, it is possible to prevent the occurrence of the scattering of unnecessary linear polarized light in a defect portion of the first reflective film 22. Furthermore, according to the defect of the first reflective film 22, it is possible to prevent the generation of defects of reliability such as material constituting the first reflective film 22 is dispersed in the base member 21, the color filter 26, or the like, a display function is lowered by dispersing the material in the liquid crystal layer 50 according to the lapse of time, or the like.

(3) The second protective film 23b is formed to cover a surface of the base member 21 on which the light shielding portion 25 is formed. Therefore, it is possible to improve adhesiveness between the color filter 26 and surfaces of the light shielding portion 25 and the base member 21 on the colored layer formed region 25a, compared to a case where the second protective film 23b is not formed. In addition, in a forming process of the color filter 26, it is possible to secure the light shielding portion 25 by the second protective film 23b. That is, it is possible to effectively manufacture the opposing substrate 20, as the substrate for an electro-optical device, including the color filter 26.

Second Embodiment

Electro-Optical Device

Figure 19:
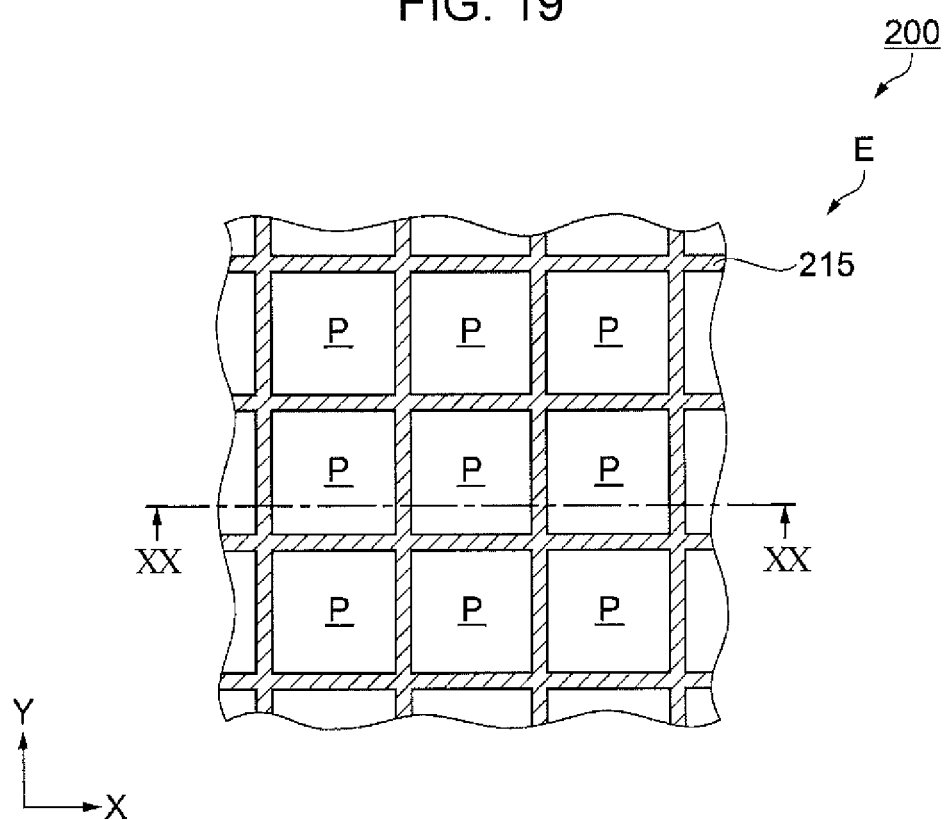
FIG. 19 is a schematic plan view illustrating an arrangement of pixels and a light shielding portion in a display region of a liquid crystal device of a second embodiment.
Figure 20:
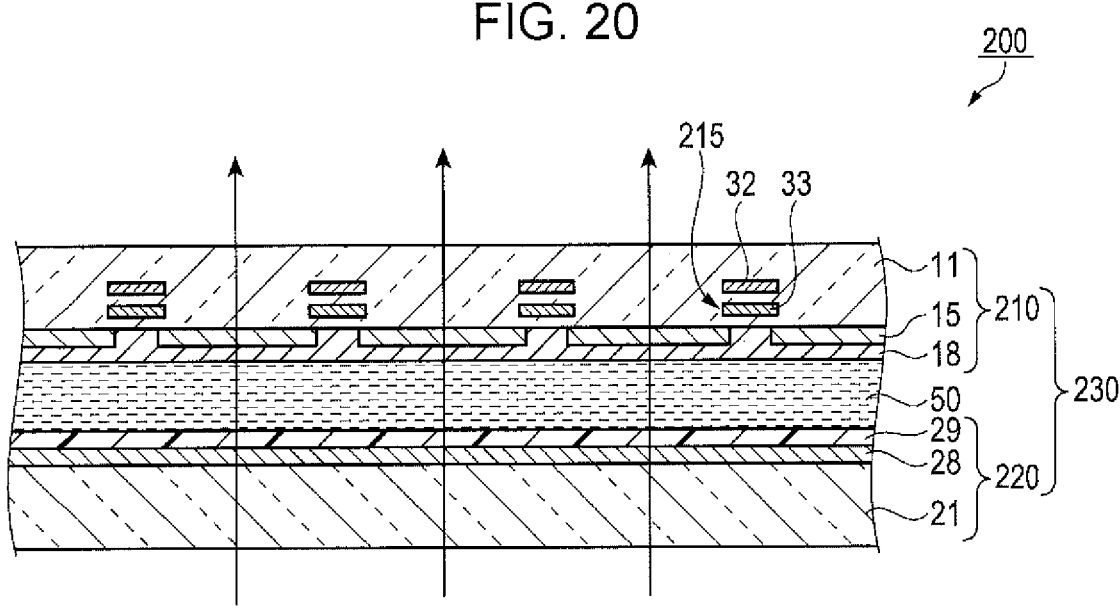
FIG. 20 is a schematic sectional view illustrating a structure of the liquid crystal panel of the second embodiment taken along line XX-XX of FIG. 19.
Figure 21:
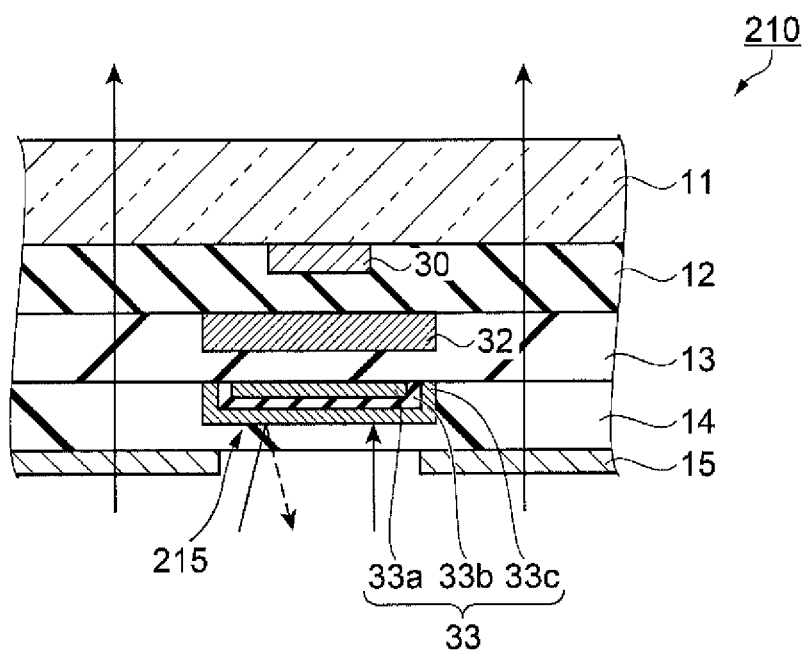
FIG. 21 is an enlarged sectional view illustrating a structure of the light shielding portion on an element substrate of the second embodiment.

Next, for the electro-optical device of a second embodiment, an example of the liquid crystal device will be described with reference to FIG. 19 to FIG. 21, similar to the first embodiment. FIG. 19 is a schematic plan view illustrating an arrangement of pixels and a light shielding portion in a display region E of a liquid crystal device of a second embodiment. FIG. 20 is a sectional view illustrating a structure of the liquid crystal panel of the second embodiment taken along line XX-XX of FIG. 19. FIG. 21 is an enlarged sectional view illustrating a structure of the light shielding portion on an element substrate.

The liquid crystal device 200 as the electro-optical device of the second embodiment includes an example of the light shielding portion of the invention on the element substrate side without providing the color filter 26 on the opposing substrate side, with respect to the liquid crystal device 100 of the first embodiment. Therefore, the same reference numerals will be attached to the same configuration as the liquid crystal device 100 of the first embodiment such that the detailed description thereof will be omitted, and another configuration will be described.

As described in FIG. 19, the liquid crystal device 200 as an electronic apparatus of the embodiment includes a plurality of pixels P disposed in a matrix, in the X axis direction and the Y axis direction on the display region E. Each of the plurality of pixels P is disposed in a region partitioned by the light shielding portion 215, and a shape of the pixels P in a plan view is a square. The light shielding portion 215 is disposed in a lattice by extending the light shielding portion 215 in the X axis direction and the Y axis direction, and constitutes a non-opening region.

A pixel circuit of the pixels P is configured to include the pixel electrodes 15, the TFT 30, and the retention capacitor 34, similar to the liquid crystal device 100 of the first embodiment (see FIG. 3). In addition, the TFT 30, the scan lines 31 and the data lines 32 connected to the TFT 30, and retention capacitor 34 and the capacitance lines 33 connected to the retention capacitor 34 are formed on the light shielding portion 215 on which the non-opening region is formed.

As described in FIG. 20, the liquid crystal device 200 includes the liquid crystal panel 230 including the element substrate 210 and the opposing substrate 220 that are opposed by pinching the liquid crystal layer 50. The opposing substrate 220 includes the transparent base member 21, the opposing electrodes 28 provided on one side of the base member 21, and the alignment film 29 that covers the opposing electrodes 28. The light shielding portion 25 and the color filter 26 such as the first embodiment are not provided on the opposing substrate 220.

The element substrate 210 includes the transparent base member 11, the pixel electrodes 15 are provided for each of pixels P provided on one surface of the base member 11, and the alignment film 18 that covers a plurality of pixel electrodes 15. In addition, the data lines 32, the capacitance lines 33, or the like described above are provided between the adjacent pixel electrodes 15 of the base member 11. The light incident from the opposing substrate 220 side is modulated based on image information by passing through the liquid crystal layer 50 between the pixel electrodes 15 and the opposing electrodes 28, and emitted as display light from the element substrate 210 side. The liquid crystal device 200 is preferably used as a light modulation element (liquid crystal light valve), for example, of a projection-type display device 1000 (see FIG. 23) described below. A polarization element is disposed based on an optical design of the liquid crystal panel 230 on the incident side and the emission side of light of a liquid crystal panel 230.

In the embodiment, the capacitance lines 33 that are a wiring line disposed at a side in vicinity of the pixel electrodes 15 are configured to function as the light shielding portion 215, in the base member 11. That is, the element substrate 210 is an example of the "substrate for an electro-optical device" of the invention.

Specifically, as described in FIG. 21, the element substrate 210 includes the base member 11, the TFT 30 provided on one surface of the base member 11, a first interlayer insulating film 12 that covers the TFT 30, the data lines 32 provided on the first interlayer insulating film 12, and a second interlayer insulating film 13 that covers the data lines 32. In addition, the element substrate 210 includes the capacitance lines 33 provided on the second interlayer insulating film 13, a third interlayer insulating film 14 that covers the capacitance lines 33, and the pixel electrodes 15 provided on the third interlayer insulating film 14. On the base member 11, the TFT 30, the data lines 32, and the capacitance lines 33 are provided so as to overlap regions between the adjacent pixel electrodes 15.

The capacitance lines 33 include the first wiring portion 33a as the first reflective film provided on the second interlayer insulating film 13, an insulating film 33b as the first protective film that covers the first wiring portion 33a, and a second wiring portion 33c as the second reflective film provided to overlap the second reflective film with the first wiring portion 33a through the insulating film 33b. That is, the insulating film 33b as the first protective film is disposed between the first wiring portion 33a as the first reflective film and the second wiring portion 33c as the second reflective film. In other words, the capacitance lines 33 as the light shielding portion 215 are configured to include the first wiring portion 33a, the insulating film 33b, and the second wiring portion 33c.

It is possible to form the first wiring portion 33a by using, for example, aluminum, aluminum alloy, silver, silver alloy, tungsten silicide, or the like. For example, it is possible to form the second wiring portion 33c by using metal nitride, for example, titanium nitride, or the like. The insulating film 33b may be formed to have translucency by using, for example, silicon oxide or silicon nitride, may use an oxide aluminum film formed by performing, for example, thermal oxidation treatment on a surface of the first wiring portion 33a formed with aluminum and aluminum alloy. The first wiring portion 33a is electrically connected to the retention capacitor 34. In addition, a contact hole may be provided in the insulating film 33b, and the first wiring portion 33a and the second wiring portion 33c may be electrically connected to each other.

The first interlayer insulating film 12, the second interlayer insulating film 13, and the third interlayer insulating film 14 are also formed to have translucency by using, for example, silicon oxide, silicon nitride, and the like. Therefore, light incident from the opposing substrate 220 side to the pixel electrodes 15 is emitted from the base member 11 side by passing through these interlayer insulating films 12, 13, and 14. Meanwhile, light incident between the pixel electrodes 15 is reflected or absorbed by the second wiring portion 33c. Since the second wiring portion 33c is formed by using a material having a low reflection rate compared to the first wiring portion 33a, it is possible to reduce a rate of internal reflection light reflected at the second wiring portion 33c. That is, by including the element substrate 210 including the capacitance lines 33 that function as the light shielding portion 215, it is possible to provide the liquid crystal device 200 capable of suppressing the reduction of contrast caused by internal reflection and realizing excellent display quality. In addition, since the first wiring portion 33a is protected by the insulating film 33b, even in a case where position deviates by not sufficiently ensuring the positional accuracy of a register pattern at the time of patterning of the second wiring portion 33c, it is possible to prevent defects such as the first wiring portion 33a is etched, or dissolved by the peeling solution.

Third Embodiment

Figure 22:
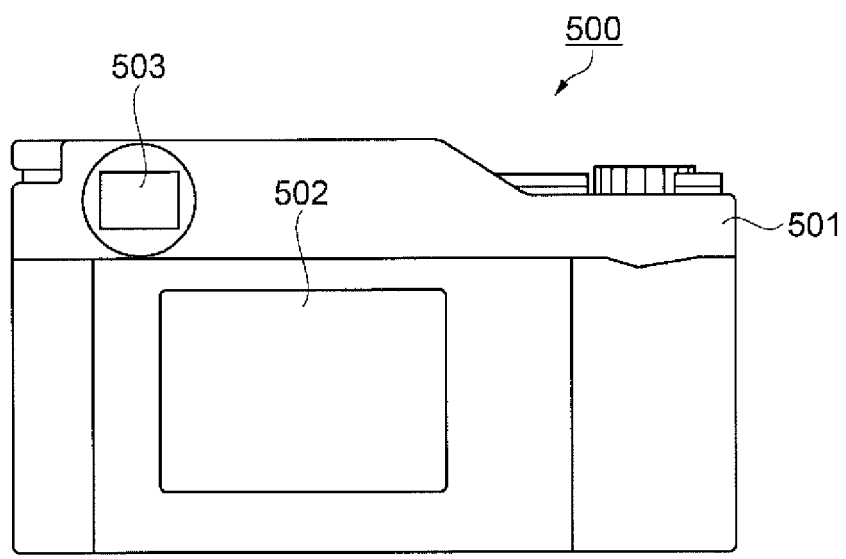
FIG. 22 is a schematic view illustrating a configuration of a digital camera as an electronic apparatus.
Figure 23:
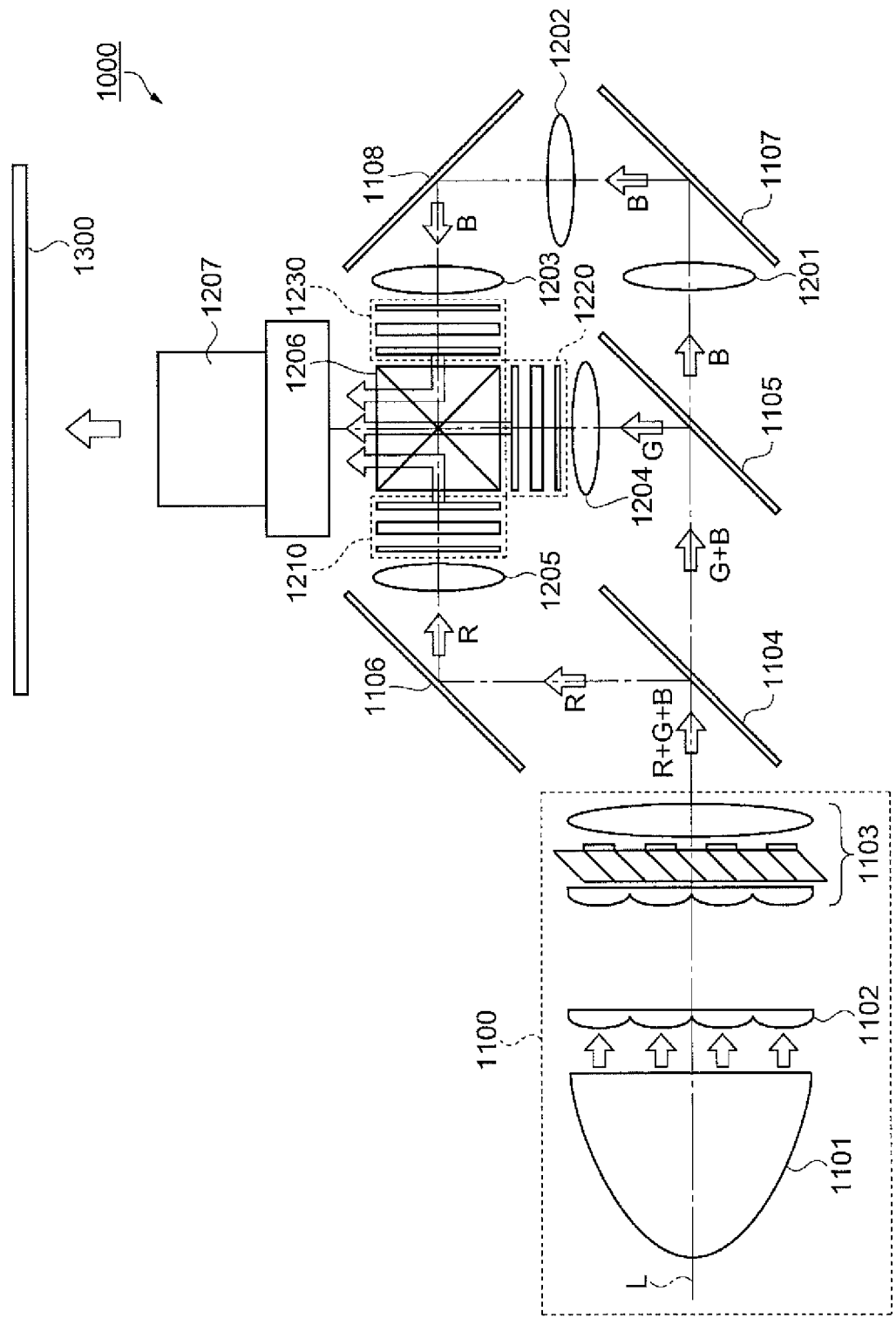
FIG. 23 is a schematic view illustrating a configuration of a projection-type display device as another electronic apparatus.

Next, an electronic apparatus of the embodiment will be described with reference to FIG. 22 and FIG. 23. FIG. 22 is a schematic view illustrating a configuration of a digital camera as the electronic apparatus. FIG. 23 is a schematic view illustrating a configuration of a projection-type display device as another electronic apparatus.

As described in FIG. 22, a digital camera 500 as the electronic apparatus of the embodiment includes a main body 501 having an optical system such as a capturing element, or the like. The monitor 502 that displays a captured image, or the like, and an electronic view finder 503 for viewing subjects are provided in the main body 501. The liquid crystal device 100 according to the first embodiment is mounted in the electronic view finder 503.

Since the liquid crystal device 100 according to the first embodiment is mounted in the electronic view finder 503, it is possible to provide the digital camera 500 capable of reducing the internal reflection, having excellent display quality, and appropriately viewing the object. In addition, it is possible to also apply the liquid crystal device 100 of the first embodiment in the monitor 502.

As described in FIG. 23, the projection-type display device 1000 as another electronic apparatus of the embodiment includes a polarized illumination apparatus 1100 disposed along a system optical axis L, two dichroic mirrors 1104 and 1105 as a light separating element, three reflecting mirrors 1106, 1107, and 1108, five relay lens 1201, 1202, 1203, 1204, and 1205, three transmissive-type liquid crystal light valves 1210, 1220, and 1230 as the light modulation element, a cross dichroic prism 1206 as a photosynthesis element, and a projection lens 1207.

The polarized illumination apparatus 1100 is schematically configured by a lamp 1101 as a light source of a white light source such as an ultra-high pressure mercury lamp, a halogen lamp, and the like, an integrator lens 1102, and a polarization conversion element 1103.

The dichroic mirror 1104 reflects the red light (R), and absorbs the green light (G) and the blue light (B), among polarized light beams emitted from the polarized illumination apparatus 1100. The other dichroic mirror 1105 reflects the green light (G) passing through the dichroic mirror 1104, and allows the blue light (B) to pass through.

The red light (R) reflected on the dichroic mirror 1104 is incident on the liquid crystal light valve 1210 via the relay lens 1205 after reflecting on the reflecting mirror 1106.

The green light (G) reflected on the dichroic mirror 1105 is incident on the liquid crystal light valve 1220 via the relay lens 1204.

The blue light (B) passing through the dichroic mirror 1105 is incident on the liquid crystal light valve 1230 via a light guide system formed by the three relay lens 1201, 1202, and 1203, and the two reflecting mirrors 1107 and 1108.

The liquid crystal light valves 1210, 1220, and 1230 are oppositely disposed on incident surfaces for respective colors of light of the cross dichroic prism 1206, respectively. The colors of light incident on the liquid crystal light valves 1210, 1220, and 1230 are modulated based on image information (image signal), and emitted toward the cross dichroic prism 1206. The prism in which four rectangular prisms are attached, and a dielectric multilayer film that reflects the red light in an internal surface thereof and the dielectric multilayer film that reflects the blue light are formed in a cross shape, is configured. The three colors of light are combined by these dielectric multilayer films, and light representing a color image is combined. The combined light is projected on a screen 1300 by the projection lens 1207 that is a projection optical system, and an image is enlarged and displayed thereon.

The liquid crystal device 200 of the second embodiment is applied to the liquid crystal light valve 1210. The same is also applied to other liquid crystal light valves 1220 and 1230.

According to the projection-type display device 1000, since the liquid crystal device 200 is used as the liquid crystal light valves 1210, 1220, and 1230, it is possible to provide the projection-type display device 1000 capable of reducing the internal reflection, and projecting images with excellent display quality.

The electronic apparatus capable of applying the liquid crystal device 100 of the first embodiment and the liquid crystal device 200 of the second embodiment can be applied to a display unit of various electronic apparatuses such as head-mounted displays (HMD), head-up displays (HUD), mobile computers, digital video cameras, in-vehicle apparatuses, audio apparatuses, information terminal apparatuses, and the like, in addition to the digital camera 500 and the projection-type display device 1000 described above.

The invention is not limited to the above-described embodiments, and can be suitably changed without departing from the gist or spirit of the invention read from claims and the entirety of the specification. The substrate for an electro-optical device involving such changes, the electro-optical device and the electronic apparatus to which the substrate for an electro-optical device is applied are also included within the technical range of the invention. Various modification examples other than the above embodiments can be implemented. Hereinafter, modification examples will be described.

Modification Example 1

In the opposing substrate 20 of the liquid crystal device 100 of the first embodiment, the second protective film 23b that covers the light shielding portion 25 is not essential. Since the color filter 26 is covered by the OC layer 27, it is possible to compensate for adhesion with respect to the base member 21 of the colored layers 26R, 26G, and 26B without providing the second protective film 23b.

Modification Example 2

In the liquid crystal device 100 of the first embodiment, white light is not limited to being incident from the opposing substrate 20 side. The white light may be incident from the element substrate 10 side. The same is also applied to the liquid crystal device 200 of the second embodiment. In a case where light is from the element substrate side, the light shielding portion for shielding the light incident on the TFT 30 is provided such that the light is not incident on the TFT 30. The configuration of the light shielding portion of the invention may be applied to the light shielding portion.

Modification Example 3

In the liquid crystal device 200 of the second embodiment, a wiring line having a function of the light shielding portion 215 is not limited to the capacitance lines 33. For example, a shield layer may be provided at a position in the vicinity of the pixel electrodes 15. In order to prevent the effect of a potential being applied to various wiring lines, or the like provided in a lower layer of the pixel electrodes 15 on a potential to be applied to the pixel electrodes 15, the shield layer, for example, a fixed potential such as a GND potential, and the like is applied.

Modification Example 4

In the element substrate 10 of the liquid crystal device 100 of the first embodiment, the light shielding portion 215 (for example, capacitance lines 33) may be applied in the liquid crystal device 200 of the second embodiment. In addition, in the liquid crystal device 200 of the second embodiment, the embodiment is not limited to the application of the light shielding portion 215 to the element substrate 210, for example, the light shielding portion 215 of a lattice shape for partitioning a plurality of pixels P may be provided on the opposing substrate 220. With this, it is possible to further reduce the internal reflection.

Modification Example 5

The substrate for an electro-optical device including the light shielding portion of the invention is not limited to applying to the liquid crystal devices 100 and 200 of a light receiving type. For example, it is also possible to apply an organic EL element of an active-driven type organic EL element including an organic EL element as a light emitting element for each of the pixels P. More specifically, a top emission type organic EL device capable of performing full-color display by disposing the light shielding portion 25 and the color filter 26 on the opposing substrate oppositely disposed with respect to the element substrate on which an organic EL element that emits white light is provided, a bottom emission type organic EL device in which the light shielding portion 215 is disposed on the element substrate on which an organic EL device including a transparent pixel electrode and a reflective opposing electrode is provided, or the like may be considered.

The entire disclosure of Japanese Patent Application No. 2015-192904, filed Sep. 30, 2015 is expressly incorporated by reference herein.

What is claimed is:

1. An electro-optical device having a plurality of pixels including a first pixel and a second pixel adjacent to the first pixel comprising:
   a base member;
   a first color filter disposed over a surface of the base member, the first color filter being included in the first pixel;
   a second color filter disposed over the surface of the base member, the second color filter being included in the second pixel;
   a first reflective film disposed so as to overlap with a region between a first pixel and a second pixel in plan view, the first reflective film being disposed between the region and the surface of the base member;
   a second reflective film disposed to overlap with the first reflective film in plan view, the second reflective film being disposed between the region and the first reflective film; and
   a first protective film that covers the first reflective film, is provided between the first reflective film and the second reflective film.

2. The electro-optical device according to claim 1, wherein the first reflective film including aluminum.

3. The electro-optical device according to claim 1, wherein the first reflective film including silver.

4. The electro-optical device according to claim 1, wherein the first reflective film including tungsten.

5. The electro-optical device according to claim 1, wherein the second reflective film including titanium.

6. The electro-optical device according to claim 1, wherein the second reflective film including tungsten.

7. The electro-optical device according to claim 1, wherein the first reflective film including metal nitride.

8. The electro-optical device according to claim 1, wherein the first protective film is formed from a silicon oxide film.

9. The electro-optical device according to claim 1, wherein the second reflective film includes an eaves portion protruded from a region on which the first reflective film is provided, in plan view.

10. The electro-optical device according to claim 1, wherein the thickness of the second reflective film is equal to or greater than 50 nm.

11. The electro-optical device according to claim 1, further comprising:
    a second protective film that covers the second reflective film, and is provided over at least a region including the plurality of pixels.

12. The electro-optical device according to claim 11, wherein the first protective film and the second protective film are formed from the same material.

13. An electro-optical device having a plurality of pixels including a first pixel and a second pixel adjacent to the first pixel comprising:
    a base member;
    a first color filter disposed over a surface of the base member, the first color filter being included in the first pixel;
    a second color filter disposed over the surface of the base member, the second color filter being included in the second pixel;
    a first reflective film disposed so as to overlap with a region between a first pixel and a second pixel in plan view, the first reflective film being disposed between the region and the surface of the base member;

a second reflective film disposed to overlap with the first reflective film in plan view, the second reflective film being disposed between the region and the first reflective film; and a first protective film that covers the first reflective film, is provided between the first reflective film and the second reflective film, and is in direct contact with both the first reflective film and the second reflective film.

14. An electro-optical device having a plurality of pixels including a first pixel and a second pixel adjacent to the first pixel comprising:

a base member;

a first color filter disposed over a surface of the base member, the first color filter being included in the first pixel;

a second color filter disposed over the surface of the base member, the second color filter being included in the second pixel;

a first reflective film disposed so as to overlap with a region between a first pixel and a second pixel in plan view, the first reflective film being disposed between the region and the surface of the base member, the first reflective film including aluminum;

a second reflective film disposed to overlap with the first reflective film in plan view, the second reflective film being disposed between the region and the first reflective film, the second reflective film including titanium; and a first protective film that covers the first reflective film, is provided between the first reflective film and the second reflective film.

15. An electronic apparatus comprising:
the electro-optical device according to claim 1.

16. An electronic apparatus comprising:
the electro-optical device according to claim 13.

17. An electronic apparatus comprising:
the electro-optical device according to claim 14.

* * * * *